(12) United States Patent
Ooyabu

(10) Patent No.: US 7,915,958 B2
(45) Date of Patent: Mar. 29, 2011

(54) AMPLIFIER

(75) Inventor: Hirokazu Ooyabu, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 12/289,520

(22) Filed: Oct. 29, 2008

(65) Prior Publication Data

US 2009/0108940 A1    Apr. 30, 2009

(30) Foreign Application Priority Data

Oct. 30, 2007  (JP) .................................. 2007-282015

(51) Int. Cl.
   *H03F 1/30*   (2006.01)
(52) U.S. Cl. .......................... 330/290; 330/288; 330/291
(58) Field of Classification Search .................. 330/290, 330/288, 291
   See application file for complete search history.

(56) References Cited

U.S. PATENT DOCUMENTS

| | | | | |
|---|---|---|---|---|
| 4,260,955 A | * | 4/1981 | Ahmed | .......................... 330/288 |
| 4,356,454 A | | 10/1982 | Sueyoshi et al. | |
| 4,626,794 A | * | 12/1986 | Sugimoto | ...................... 330/253 |
| 5,245,222 A | * | 9/1993 | Carobolante | .................. 327/484 |
| 5,359,295 A | | 10/1994 | Nishimura | |
| 5,606,281 A | * | 2/1997 | Gloaguen | ........................ 330/51 |
| 5,844,445 A | | 12/1998 | Takeyari | |
| 6,420,931 B1 | * | 7/2002 | Maida | ............................ 330/255 |
| 2004/0141279 A1 | | 7/2004 | Amano et al. | |

FOREIGN PATENT DOCUMENTS

| | | |
|---|---|---|
| DE | 30 35 286 A1 | 4/1981 |
| GB | 2 266 021 A | 10/1993 |
| JP | 9-130157 | 5/1997 |
| JP | 09-260974 | 10/1997 |
| JP | 2004-24309 | 1/2004 |
| KR | 10-0269007 | 10/2000 |

OTHER PUBLICATIONS

Korean Office Action dated Apr. 27, 2010 (with partial English translation).

* cited by examiner

*Primary Examiner* — Patricia Nguyen
(74) *Attorney, Agent, or Firm* — McGinn IP Law Group PLLC

(57) ABSTRACT

An amplifier comprises an input terminal that inputs an AC voltage signal; an amplifying unit having a transistor for amplifying the input AC voltage signal; a current detecting unit connected internally of said amplifying unit; and a control-current source controlled by said current detecting unit that drives an input stage of the transistor.

17 Claims, 4 Drawing Sheets

US 7,915,958 B2

AMPLIFIER

REFERENCE TO RELATED APPLICATION

This application is based upon and claims the benefit of the priority of Japanese patent application No. 2007-282015, filed on Oct. 30, 2007, the disclosure of which is incorporated herein in its entirety by reference thereto.

TECHNICAL FIELD

This invention relates to an amplifier and, more particularly, to a low-noise amplifier ideal for use in the receiver of a television set or communications equipment.

BACKGROUND

In order to achieve low noise in the receiver of a television set or communications equipment, an input signal is first amplified by a low-noise amplifier and then each is processed by following stage. Further, in the receiver of a television set, it is necessary to process a high amplitude signal. For this reason, low distortion is sought for the low-noise amplifier in addition to low noise. An example of such a low-noise amplifier is disclosed in Patent Document 1.

FIG. 3 is a circuit diagram of a preamplifier 40 described in Patent Document 1. The preamplifier 40 includes an active element 42 having a base 54 connected to an input terminal 44 of the preamplifier 40 via an input protecting circuit 60, an emitter 58 connected to a ground terminal 48 via an emitter resistor RE, and a collector 56 connected to a power supply terminal 50 via a collector resistor RL. Provided between the base 54 and the collector 56 is a first feedback loop 64 for feeding back the output of the collector 56 via an emitter follower circuit 70 and a feedback resistor 68. Provided between the emitter 58 and collector 56 is a second feedback loop 66 for feeding back the output of the collector 56 via an inverting amplifier 72.

In accordance with the preamplifier thus constructed, input impedance seen from the input terminal is lowered by the first feedback loop 64 and matching of characteristic impedance is facilitated. Further, owing to the second feedback loop 66, a large negative feedback is applied and distortion of the output waveform can be reduced even if the value of the emitter resistor RE is small.

Further, a feedback-type preamplifier referred to as a transimpedance preamplifier for opto-electronic conversion and amplification is described as related art in Patent Document 2. Specifically, a preamplifier having input means for inputting a current signal and amplifying means having transistors for amplifying the input current signal is described. This preamplifier includes a control-current source connected to the input means for shunting the input current signal, and current detecting means connected to the interior of the amplifying means, wherein the control-current source is controlled by the current detecting means. The control-current source is connected in parallel with the input terminal in order to bypass overcurrent. A current mirror circuit with respect to current that flows into an initial-stage transistor of the transimpedance section is constructed by the control-current source and a diode, which is a current detecting means. As a result, the preamplifier is capable of changing bypass current in accordance with the current waveform of the input signal.

[Patent Document 1]
Japanese Patent Kokai Publication No. JP-P2004-24309A
[Patent Document 2]
Japanese Patent Kokai Publication No. JP-A-9-130157

SUMMARY OF THE DISCLOSURE

The entire disclosures of Patent Documents 1 and 2 are incorporated herein by reference thereto.

The following analyses are given by the present invention.

With regard to the preamplifier described in Patent Document 1, (1) and (2) in FIG. 4 indicate the results obtained by simulating a noise (NF) characteristic and distortion (IIP3) characteristic, respectively, with respect to the emitter resistor RE of the transistor 42. Here IIP3 signifies a third-order intercept point at the input. In FIG. 4, (1) is the noise characteristic (NF) of the example of the prior art, and (2) is the distortion (IIP3) characteristic. If the emitter resistor RE is enlarged, the distortion (IIP3) characteristic is improved. However, since the emitter resistor RE will produce thermal noise, the noise characteristic (NF) deteriorates. Conversely, if the emitter resistor RE is reduced, the noise characteristic (NF) improves but negative feedback diminishes and the distortion (IIP3) characteristic deteriorates. Further, since the second feedback loop 66 is actuated in order to lower distortion, the emitter resistor RE that gives rise to thermal noise cannot be eliminated. With the conventional preamplifier, therefore, it is difficult to satisfy both of the requirements of low distortion and low noise.

According to a first aspect of the present invention there is provided an amplifier which comprises: an input terminal for inputting an AC voltage signal; and amplifying means having a transistor for amplifying the input AC voltage signal. The amplifier further comprises current detecting means connected internally of the amplifying means; and a control-current source controlled by the current detecting means for driving an input stage of the transistor.

According to a second aspect of the present invention there is provided an amplifier which comprises: an input terminal that inputs an AC voltage signal; and an amplifying unit having a transistor for amplifying the input AC voltage signal. The amplifier further comprises current detecting unit connected internally of the amplifying unit; and a control-current source controlled by the current detecting unit that drives an input stage of the transistor.

The meritorious effects of the present invention are summarized as follows.

In accordance with the present invention, a signal can be subjected to negative feedback by the current detecting means (unit) without connecting a resistor to the emitter of the transistor, and it is possible to lower both the distortion and noise of the output signal.

Other features and advantages of the present invention will be apparent from the following description taken in conjunction with the accompanying drawings, in which like reference characters designate the same or similar parts throughout the figures thereof.

PREFERRED MODES OF THE INVENTION

The present invention will now be described in detail with reference to the accompanying drawings.

An amplifier according to a mode of the present invention comprises an input terminal 5 (FIG. 1) for inputting an AC voltage signal; amplifying means (unit) having a transistor Q1 (FIG. 1) for amplifying the input AC voltage signal; current detecting means Q2 (FIG. 1) connected internally of the amplifying means (unit); and a control-current source Q3 (FIG. 1) controlled by the current detecting means (unit) for driving an input stage of the transistor. The current detecting means (unit) comprises a diode connected in series with the emitter of the transistor, and the control-current source and diode construct a current mirror circuit.

The amplifier of the present invention may further comprise a bias supply terminal 4 (FIG. 1) for supplying bias to the transistor; a first resistor element R2 (FIG. 1) connected between the bias supply terminal and the control-current source; and a second resistor element R3 (FIG. 1) connected between the base of the transistor and the control-current source.

In another mode, the amplifier of the present invention may further comprise a first resistor element R2 (FIG. 2) connected between the output of the amplifying means (unit) and the control-current source; and a second resistor element R3 (FIG. 2) connected between the base of the transistor and the control-current source.

Further, the output of the amplifying means may be the collector of the transistor.

Furthermore, the transistor may be a field-effect transistor, and the collector, base and emitter may be replaced by a drain, gate and source, respectively.

The amplifier according to the present invention is so adapted that the output current of the transistor is converted to an AC signal by the current mirror and first resistor element connected to the current mirror, with the voltage signal being subjected to negative feedback.

Exemplary Embodiments of the present invention will now be described in detail with reference to the drawings.

First Exemplary Embodiment

Figure 1:
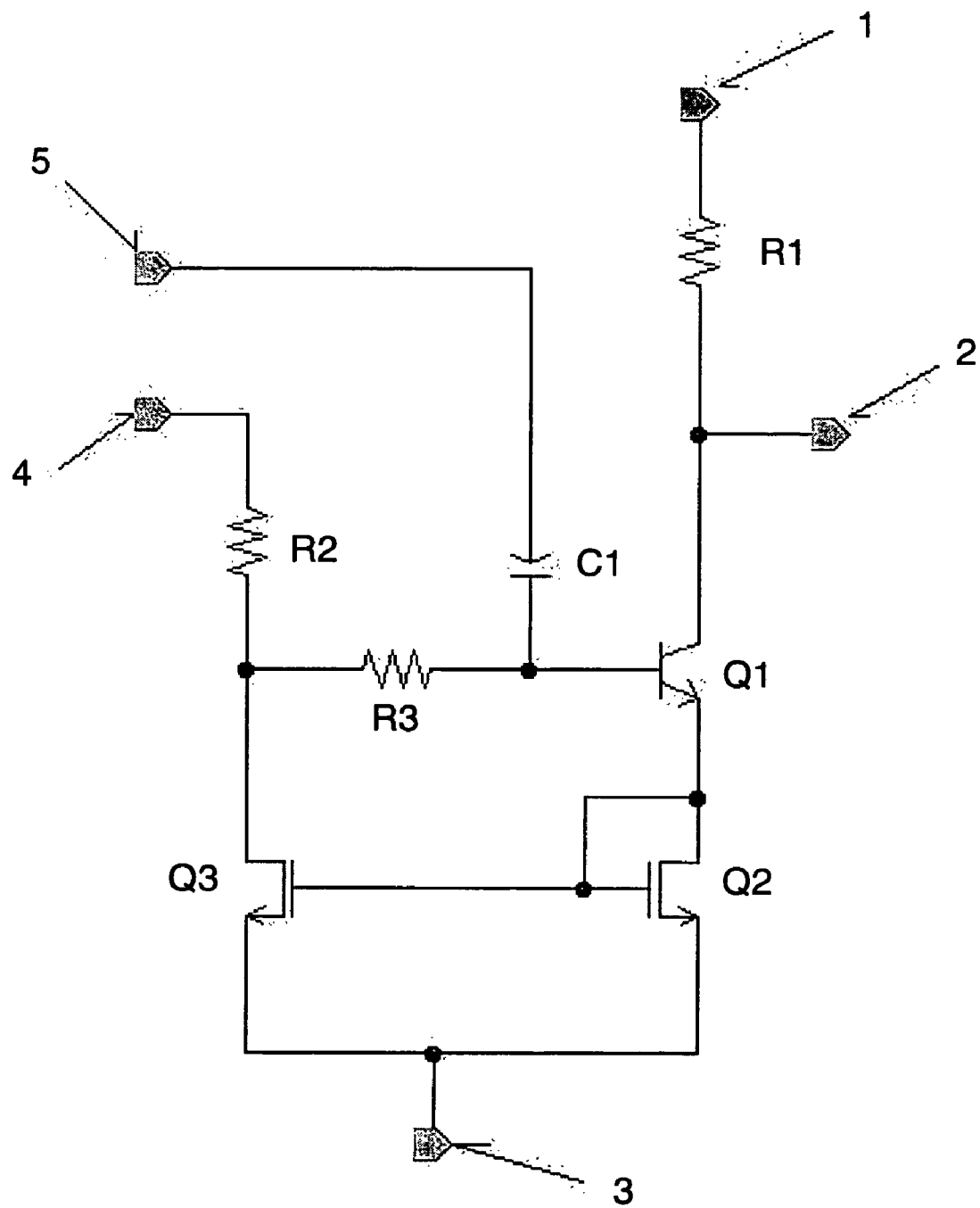
FIG. 1 is a circuit diagram of an amplifier according to a first exemplary embodiment of the present invention.

FIG. 1 is a circuit diagram of an amplifier according to a first exemplary embodiment of the present invention. As shown in FIG. 1, the amplifier includes a power supply terminal 1, an output terminal 2, a ground terminal 3, a bias supply terminal 4, an input terminal 5, a bipolar transistor Q1, NMOS transistors Q2, Q3, resistor elements R1, R2, R3 and a capacitance element C1.

The emitter of the bipolar transistor Q1, the gate and drain of the NMOS transistor Q2 and the gate of the NMOS transistor Q3 are connected. The source of the NMOS transistor Q2 and the source of the NMOS transistor Q3 are connected to a ground terminal 3. The resistor R1 is connected between the power supply terminal 1 and the collector of the bipolar transistor Q1. The resistor R2 is connected between the bias supply terminal 4 and the drain of the NMOS transistor Q3, and the resistor R3 is connected between the drain of the NMOS transistor Q3 and the base of the bipolar transistor Q1. The base of the bipolar transistor Q1 is connected to the input terminal 5 via the capacitance element C1, and the collector of the bipolar transistor Q1 is connected to the output terminal 2.

In FIG. 1, a collector current flows into the bipolar transistor Q1 in accordance with an AC voltage signal applied to the input terminal 5, and an output voltage is produced at the output terminal 2 owing to the resistor element R1. A current proportional to the collector current that flows into the bipolar transistor Q1 flows into the resistor element R2 by virtue of the current mirror circuit constructed by the NMOS transistors Q2, Q3. This current is converted to a voltage signal by the resistor element R2, and a voltage proportional to the collector current is generated at the drain of the NMOS transistor Q3. This drain voltage signal flows as negative feedback to the base of the bipolar transistor Q1 via the resistor element R3. Waveform distortion in the amplifier is reduced by this negative feedback.

Figure 3:
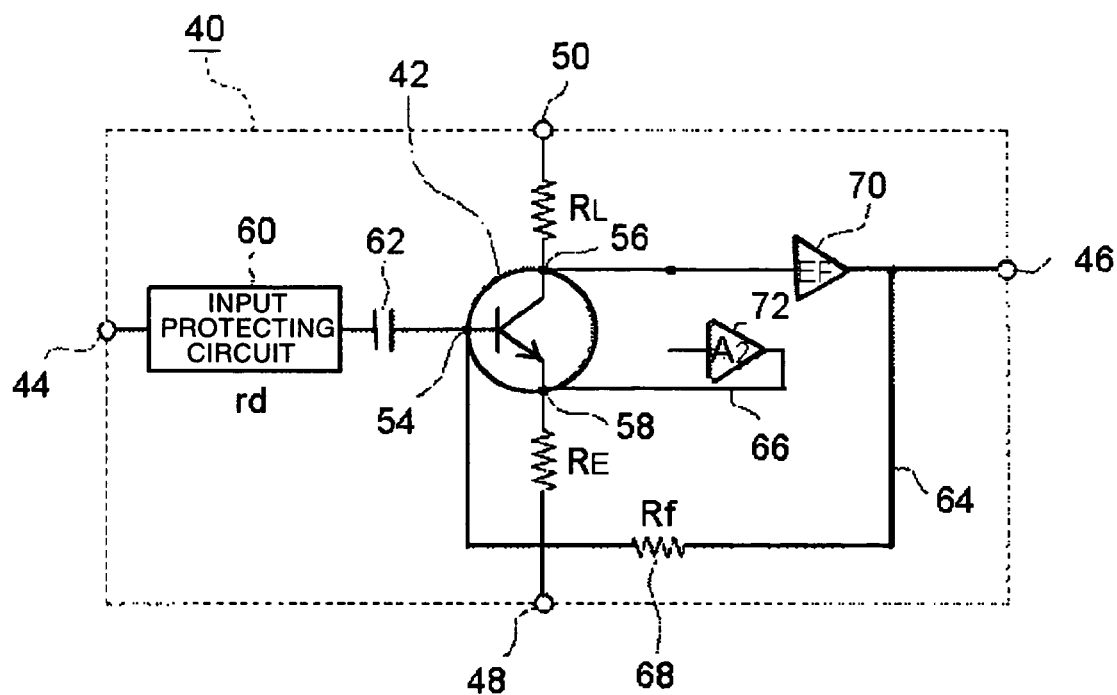
FIG. 3 is a circuit diagram of a preamplifier according to a prior art.

With the conventional preamplifier of FIG. 3, when the resistor RE is connected to the emitter 58 of the transistor 42 and negative feedback is applied, thermal noise is produced in this resistor. The thermal noise is impressed directly upon the base 54 of the transistor 42 to which the input terminal is connected, as a result of which the noise characteristic deteriorates. By contrast, the amplifier shown in FIG. 1 is such that a resistor is not connected to the emitter of the bipolar transistor Q1, conversion to a voltage signal is made using the current mirror, which comprises the NMOS transistors Q2, Q3, and the resistor R2, and negative feedback is applied. Accordingly, a low-noise characteristic is realized for the amplifier since no use is made of an emitter resistor that causes the noise characteristic to deteriorate.

Figure 4:
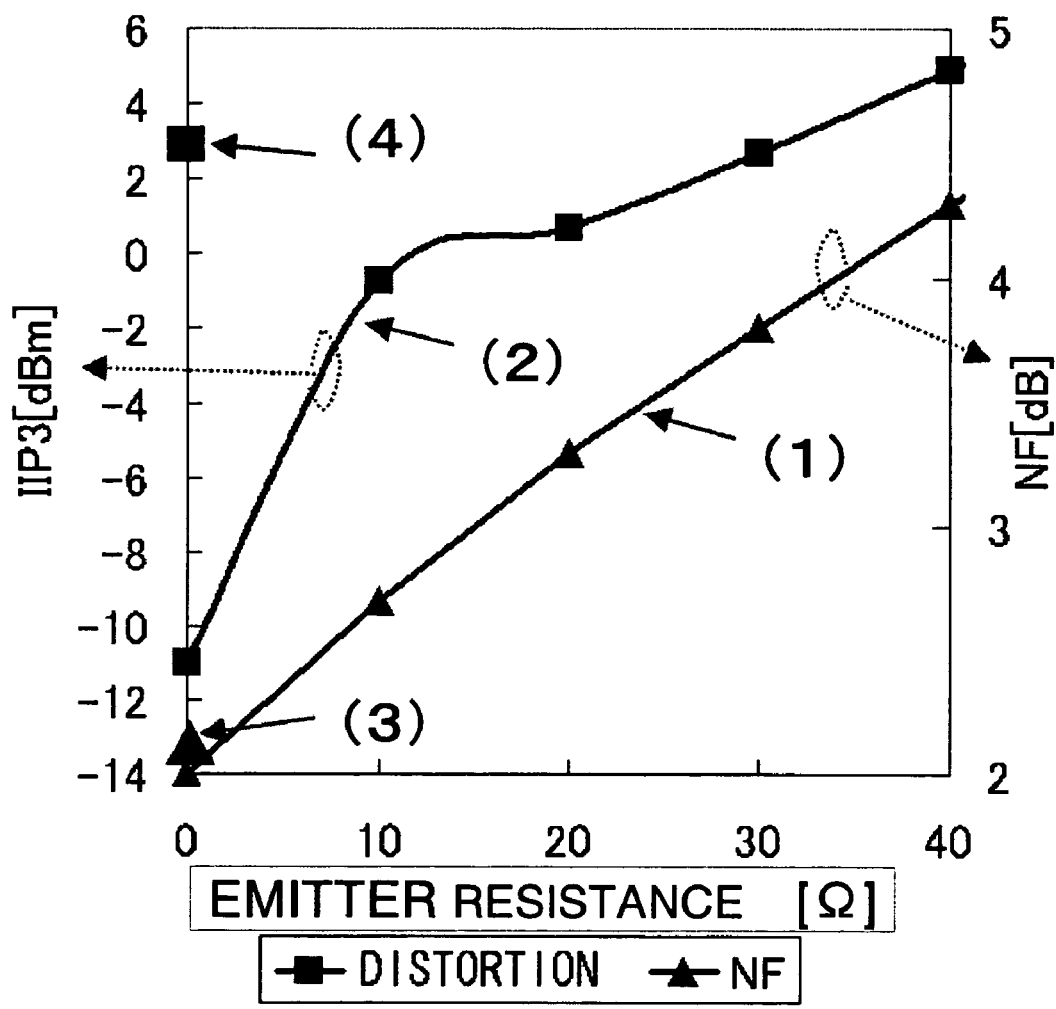
FIG. 4 shows the distortion characteristic and noise characteristic of the amplifier according to the first exemplary embodiment of the present invention and according to the preamplifier of the prior art.

In FIG. 4, plotted points (3) and (4) indicate the results obtained by simulating a noise (NF) characteristic and distortion (IIP3) characteristic, respectively, of the amplifier according to the present invention. It will be understood from FIG. 4 that, in contrast with the amplifier of the example of the prior art, both low distortion and low noise can be achieved.

Second Exemplary Embodiment

Figure 2:
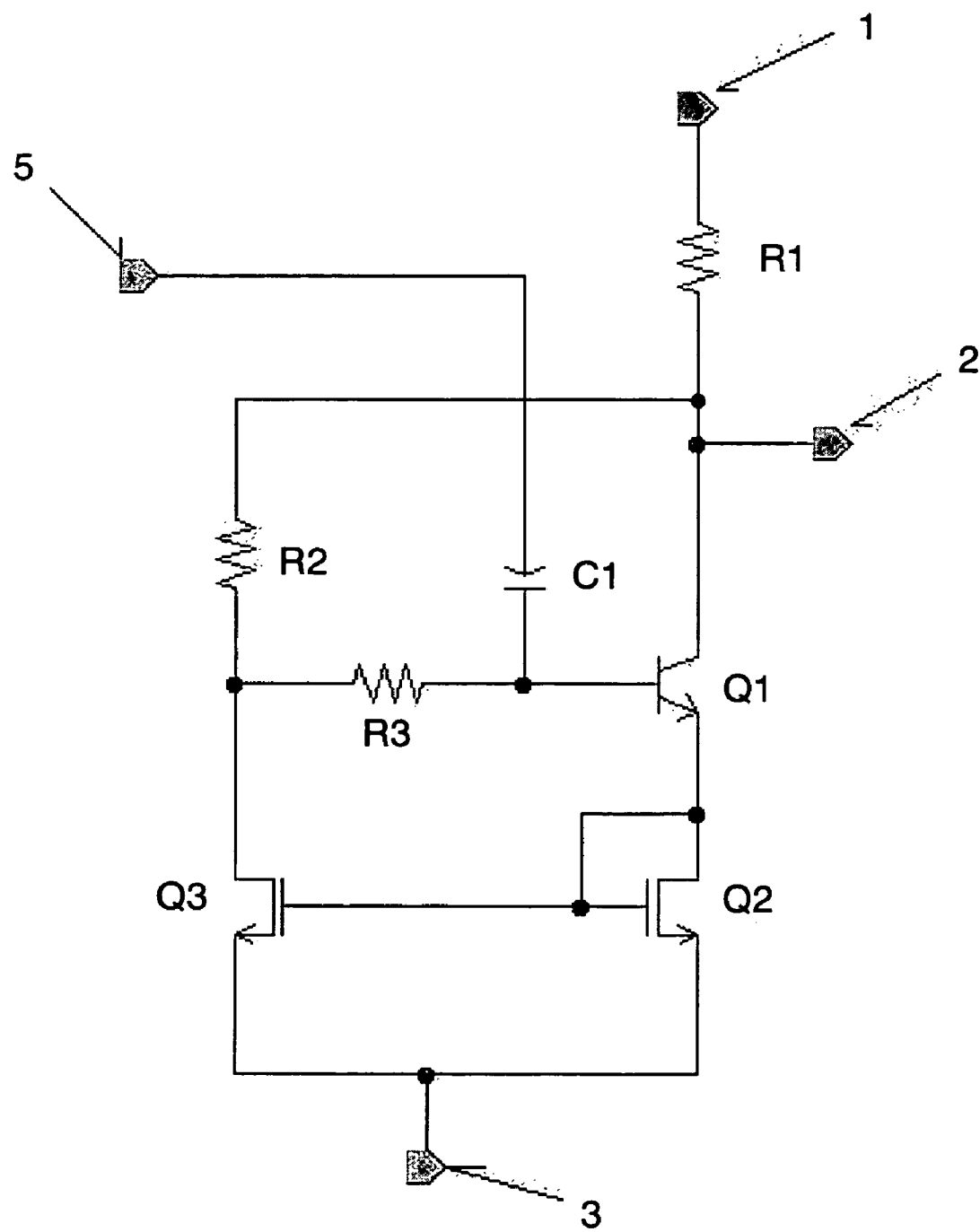
FIG. 2 is a circuit diagram of an amplifier according to a second exemplary embodiment of the present invention.

FIG. 2 is a circuit diagram of an amplifier according to a second exemplary embodiment of the present invention, in which components identical with those shown in FIG. 1 are designated by like reference characters. In the first exemplary embodiment, whereas one end of the resistor element R2 is connected to the bias supply terminal 4, as illustrated in FIG. 1, one end of the resistor element R2 is connected to the collector of the bipolar transistor Q1 in the second exemplary embodiment, as illustrated in FIG. 2. By virtue of such a connection, the output voltage signal of the bipolar transistor Q1 is also fed back as negative feedback to the base of the bipolar transistor Q1 through intervention of the resistor elements R2, R3.

In accordance with the amplifier thus constructed as compared with the circuit of FIG. 1, the number of negative feedback loops is increased to two, it is easy to design for gain and NF and impedance matching is facilitated.

Although the first and second exemplary embodiments have been described above for a case where the transistor Q1 is a bipolar transistor, this transistor may just as well be a field-effect transistor. In such case the collector, base and emitter mentioned above would be treated as a drain, gate and source, respectively.

Though the present invention has been described in accordance with the foregoing exemplary embodiments, the invention is not limited to these exemplary embodiments and it goes without saying that the invention covers various modifications and changes that would be obvious to those skilled in the art within the scope of the claims.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. An amplifier comprising:
an input terminal for inputting an AC voltage signal;
amplifying means having a transistor for amplifying the input AC voltage signal;
current detecting means connected internally of said amplifying means; and
a control-current source controlled by said current detecting means for driving an input stage of the transistor,
wherein said current detecting means comprises a diode connected in series with an emitter of said transistor, and said control-current source and said diode comprise components of a current mirror circuit.

2. The amplifier according to claim 1, further comprising:
a bias supply terminal for supplying a bias to said transistor;
a first resistor element connected between said bias supply terminal and said control-current source; and
a second resistor element connected between a base of said transistor and said control-current source.

3. The amplifier according to claim 1, further comprising:
a first resistor element connected between an output of said amplifying means and said control-current source; and
a second resistor element connected between a base of said transistor and said control-current source.

4. The amplifier according to claim 2, wherein an output of said amplifying means is a collector of said transistor.

5. The amplifier according to claim 4, wherein said transistor is a field-effect transistor and the collector, base and emitter are replaced by a drain, a gate and a source, respectively.

6. An amplifier comprising:
an input terminal that inputs an AC voltage signal;
an amplifying unit having a transistor for amplifying the input AC voltage signal;
a current detecting unit connected internally of said amplifying unit; and
a control-current source controlled by said current detecting unit that drives an input stage of the transistor,
wherein said current detecting unit comprises a diode connected in series with an emitter of said transistor, and said control-current source and said diode comprise components in a current mirror circuit.

7. The amplifier according to claim 6, further comprising:
a bias supply terminal that supplies a bias to said transistor;
a first resistor element connected between said bias supply terminal and said control-current source; and
a second resistor element connected between a base of said transistor and said control-current source.

8. The amplifier according to claim 6, further comprising:
a first resistor element connected between an output of said amplifying unit and said control-current source; and
a second resistor element connected between a base of said transistor and said control-current source.

9. The amplifier according to claim 7, wherein an output of said amplifying unit is a collector of said transistor.

10. The amplifier according to claim 9, wherein said transistor is a field-effect transistor and the collector, base and emitter are replaced by a drain, a gate and a source, respectively.

11. The amplifier of claim 1, the control-current source receiving power as a current source from a terminal of the amplifier that is connected to a dc voltage.

12. The amplifier of claim 11, wherein the dc voltage terminal comprises a bias voltage terminal of the amplifier.

13. The amplifier of claim 11, wherein the dc voltage terminal comprises a power supply terminal of the amplifier.

14. The amplifier of claim 6, the control-current source receiving power as a current source from a terminal of the amplifier connected to a dc voltage.

15. An amplifier, comprising:
an amplifier input terminal, for receiving an input signal into the amplifier;
an amplifier output terminal, for providing an output signal from the amplifier;
a first transistor and a second transistor, each respectively having a control terminal, an input terminal, and an output terminal, the first and second transistors being interconnected in a current mirror configuration formed by connecting the second transistor into a diode configuration, connecting control terminals of the first and second transistors together, and connecting output terminals of the first and second transistors together, the input terminal of the first transistor being provided with a dc voltage, thereby forming a current source in the current mirror configuration;
a third transistor functioning as an output transistor for the amplifier, the third transistor being serially interconnected between the input terminal of the second transistor and the amplifier output terminal, a control terminal of the third transistor receiving a signal from the amplifier input terminal; and
a resistor interconnecting the control terminal of the third transistor with the input terminal of the first transistor.

16. The amplifier of claim 15, as comprising at least one MOS transistor for at least one of:
the third transistor; and
the first and second transistors.

17. The amplifier of claim 15, as comprising at least one BJT transistor for at least one of:
the third transistor; and
the first and second transistors.

* * * * *